(12) United States Patent  
Ferrand et al.

(10) Patent No.: US 9,234,954 B2  
(45) Date of Patent: Jan. 12, 2016

(54) METHOD FOR CREATING A MODULE FOR CONTROLLING A HIGH-FREQUENCY ANTENNA FOR A NUCLEAR MAGNETIC RESONANCE IMAGING APPARATUS

(75) Inventors: Guillaume Ferrand, Paris (FR); Michel Luong, Sceaux (FR); Alain France, Bordeaux (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 666 days.

(21) Appl. No.: 13/580,274

(22) PCT Filed: Feb. 18, 2011

(86) PCT No.: PCT/FR2011/050351  
§ 371 (c)(1),  
(2), (4) Date: Sep. 13, 2012

(87) PCT Pub. No.: WO2011/104469  
PCT Pub. Date: Sep. 1, 2011

(65) Prior Publication Data  
US 2013/0002254 A1  Jan. 3, 2013

(30) Foreign Application Priority Data  
Feb. 24, 2010 (FR) ...................................... 10 51301

(51) Int. Cl.  
*H01P 11/00* (2006.01)  
*G01R 33/341* (2006.01)  
(Continued)

(52) U.S. Cl.  
CPC ........ *G01R 33/5612* (2013.01); *G01R 33/3415* (2013.01); *G01R 33/5659* (2013.01); *Y10T 29/49016* (2015.01)

(58) Field of Classification Search  
CPC ..................... G01R 33/34046; G01R 33/3415; G01R 33/5612; G01R 33/34; G01R 33/34076; G01R 33/5659; Y10T 29/49016  
USPC .............. 324/318, 322; 29/600; 333/219, 222  
See application file for complete search history.

(56) References Cited

U.S. PATENT DOCUMENTS 4,746,866 A  5/1988  Roschmann  
4,751,464 A  6/1988  Bridges  
(Continued)

OTHER PUBLICATIONS

International Search Report as issued for PCT/FR2011/050351.  
(Continued)

*Primary Examiner* — Melissa Koval  
*Assistant Examiner* — Rishi Patel  
(74) *Attorney, Agent, or Firm* — Pillsbury Winthrop Shaw Pittman LLP

(57) ABSTRACT

A method for creating a module for controlling a magnetic resonance imaging apparatus antenna, the method including: determining magnetic field distribution mapping $B_1^+$; constructing a matrix $\tilde{B}$ from the selection of a plurality of x*m points $B^+_{1(i,j)}$ such that $\tilde{B}_{(i,j)} - B^+_{1(i,j)}$ determining the singular vectors of the matrix $\tilde{B}$ by singular value decomposition; and arranging a coupling means and/or phase-shifting means, forming said control module, such that a signal $So_j$ outputted from the control module is a function of the equation $$So_j = \sum_{k=1}^{n} V_{k,j} \cdot Si_k,$$

with $Si_k$ being the input signal.

10 Claims, 4 Drawing Sheets

(51) Int. Cl.
*G01R 33/561* (2006.01)
*G01R 33/3415* (2006.01)
*G01R 33/565* (2006.01)

(56) References Cited

U.S. PATENT DOCUMENTS 5,557,247 A 9/1996 Vaughn, Jr.
7,336,145 B1* 2/2008 Zelinski et al. ............... 324/309
2002/0158632 A1* 10/2002 Sodickson ..................... 324/307

OTHER PUBLICATIONS

Alagappan V. et al.; "Mode Compression of Transmit and Receive arrays for Parallel Imaging at 7T" International Society for Magnetic Resonance in Medicine. Scientific Meeting and Exhibition. Proceedings, International Society for Magnetic Resonance in Medicine, US, vol. 16, Jan. 1, 2008, p. 619, XP002586932.
Zelinski et al.; "Sparsity-Enforced Coil Array Mode Compression for Parallel Transmission", 16th Annual ISMRM Scientific Meeting and Exhibition 2008, Toronto, Ontario, Cananda, May 3-9, 2008, Curran, Red Hook, NY, May 3, 2008, p. 1302, XP002589489.
Katscher et al.; "Parallel Magetic Resonance Imaging", vol. 4, No. 3, Jun. 25, 2007, pp. 499-510, XP022127927, p. 504-507.
Setsompop K. et al., "Slice-Selective RF Pulses for In Vivo $B_1^+$ Inhomogeneity Mitigation at 7 Tesla Using Parallel RF Excitation With a 16-Element Coil" Magnetic Resonance in Medicine 60; pp. 1422-1432 (2008); XP007915199.
Yarnykh V L; "Actual Flip-Angle Imaging in the Pulsed Steady State: A Method for Rapid Three-Dimensional Mapping of the Transmitted Radiofrequency Field", Magnetic Resonance in Medicine, vol. 57, Jan. 1, 2007, pp. 192-2000.

* cited by examiner $$V_n^a\left(\theta_{1,n},\ldots,\theta_{7,n},\phi_{1,n},\ldots,\phi_{15,n}\right) =$$

$$\begin{bmatrix}
e^{j\phi_{1,n}}j\cos\theta_{1,n} & e^{j\phi_{1,n}}\sin\theta_{1,n} & 0 & 0 & 0 & 0 & 0 & 0 & 0 & 0 & 0 & 0 & 0 & 0 & 0 \\
e^{j\phi_{2,n}}\sin\theta_{1,n} & e^{j\phi_{2,n}}j\cos\theta_{1,n} & 0 & 0 & 0 & 0 & 0 & 0 & 0 & 0 & 0 & 0 & 0 & 0 & 0 \\
0 & 0 & e^{j\phi_{3,n}}j\cos\theta_{2,n} & e^{j\phi_{3,n}}\sin\theta_{2,n} & 0 & 0 & 0 & 0 & 0 & 0 & 0 & 0 & 0 & 0 & 0 \\
0 & 0 & e^{j\phi_{4,n}}\sin\theta_{2,n} & e^{j\phi_{4,n}}j\cos\theta_{2,n} & 0 & 0 & 0 & 0 & 0 & 0 & 0 & 0 & 0 & 0 & 0 \\
0 & 0 & 0 & 0 & e^{j\phi_{5,n}}j\cos\theta_{3,n} & e^{j\phi_{5,n}}\sin\theta_{3,n} & 0 & 0 & 0 & 0 & 0 & 0 & 0 & 0 & 0 \\
0 & 0 & 0 & 0 & e^{j\phi_{6,n}}\sin\theta_{3,n} & e^{j\phi_{6,n}}j\cos\theta_{3,n} & 0 & 0 & 0 & 0 & 0 & 0 & 0 & 0 & 0 \\
0 & 0 & 0 & 0 & 0 & 0 & e^{j\phi_{7,n}}j\cos\theta_{4,n} & e^{j\phi_{7,n}}\sin\theta_{4,n} & 0 & 0 & 0 & 0 & 0 & 0 & 0 \\
0 & 0 & 0 & 0 & 0 & 0 & e^{j\phi_{8,n}}\sin\theta_{4,n} & e^{j\phi_{8,n}}j\cos\theta_{4,n} & 0 & 0 & 0 & 0 & 0 & 0 & 0 \\
0 & 0 & 0 & 0 & 0 & 0 & 0 & 0 & e^{j\phi_{9,n}}j\cos\theta_{5,n} & e^{j\phi_{9,n}}\sin\theta_{5,n} & 0 & 0 & 0 & 0 & 0 \\
0 & 0 & 0 & 0 & 0 & 0 & 0 & 0 & e^{j\phi_{10,n}}\sin\theta_{6,n} & e^{j\phi_{10,n}}j\cos\theta_{6,n} & 0 & 0 & 0 & 0 & 0 \\
0 & 0 & 0 & 0 & 0 & 0 & 0 & 0 & 0 & 0 & e^{j\phi_{11,n}}j\cos\theta_{6,n} & e^{j\phi_{11,n}}\sin\theta_{6,n} & 0 & 0 & 0 \\
0 & 0 & 0 & 0 & 0 & 0 & 0 & 0 & 0 & 0 & e^{j\phi_{12,n}}\sin\theta_{6,n} & e^{j\phi_{12,n}}j\cos\theta_{6,n} & 0 & 0 & 0 \\
0 & 0 & 0 & 0 & 0 & 0 & 0 & 0 & 0 & 0 & 0 & 0 & e^{j\phi_{13,n}}j\cos\theta_{7,n} & e^{j\phi_{13,n}}\sin\theta_{7,n} & 0 \\
0 & 0 & 0 & 0 & 0 & 0 & 0 & 0 & 0 & 0 & 0 & 0 & e^{j\phi_{14,n}}\sin\theta_{7,n} & e^{j\phi_{14,n}}j\cos\theta_{7,n} & 0 \\
0 & 0 & 0 & 0 & 0 & 0 & 0 & 0 & 0 & 0 & 0 & 0 & 0 & 0 & e^{j\phi_{15,n}}
\end{bmatrix}$$

Fig. 5

METHOD FOR CREATING A MODULE FOR CONTROLLING A HIGH-FREQUENCY ANTENNA FOR A NUCLEAR MAGNETIC RESONANCE IMAGING APPARATUS

CROSS REFERENCE TO RELATED APPLICATIONS

This application is the U.S. National Stage of PCT/FR2011/050351, filed Feb. 18, 2011, which in turn claims priority to French Patent Application No. 1051301, filed Feb. 4, 2010, the entire contents of all applications are incorporated herein by reference in their entireties.

The present invention relates to the control of a high-frequency antenna with multiple receiving and/or transmission channels, used in Nuclear Magnetic Resonance (NMR) apparatuses and applications thereof: Magnetic Resonance Imaging (MRI) for human or animal subjects, Magnetic Resonance Spectroscopy (MRS) and even diffusion tensor imaging.

The field of the invention is that of Nuclear Magnetic Resonance (NMR), and more particularly that of phased array type high-frequency antennas used in Nuclear Magnetic Resonance (NMR) apparatuses with a very strong magnetic field, that is to say equal to or greater than 7 Tesla.

The invention particularly relates to the control of a phased array type high-frequency antenna used to examine a part of the human body, such as a patient's head.

The antennas of MRI apparatuses are made up of radiating elements in known manner, the radiating elements consisting of copper or copper strips that serve either as transmitter coils, in resonance with the circuit by which they are supplied, or as receivers of relaxation signals, or more generally alternating between these two roles. They surround the patient or just the body part that is to be analysed.

When placed within the permanent longitudinal magnetic field $B_0$ of an NMR apparatus, they receive electrical excitation that enables them to produce a radiofrequency (RF) magnetic field $B_1^+$ orthogonal to $B_0$ at the precession resonance frequency (also called the Larmor frequency) of the atom nuclei that are under examination and are located within magnetic field $B_0$, and/or they receive echo $B_1^{-'}$ which is also a radiofrequency wave at the Larmor frequency, which is produced by the atoms that have briefly been exposed to magnetic field $B_1^+$.

It will be recalled that under the influence of static magnetic field $B_0$ the spin magnetic moments of the hydrogen atom nuclei will align themselves progressively in a direction that is initially parallel to magnetic field $B_0$, thus causing global magnetisation in the direction of field $B_0$, this being longitudinal direction z.

When excitation is applied in the form of a pulse, that is to say a magnetic field that oscillates at the Larmor frequency, designated $B_1^+$, the spin magnetic moments will then resonate and deviate progressively from this longitudinal axis z, eventually becoming aligned perpendicularly to the original axis, describing a movement that is called precession movement. Magnetic field $B_1^+$ thus enables the spin magnetic moments to be "flipped" through a flip angle FA and aligned in a plane perpendicular to the direction of field $B_0$.

When the excitation is interrupted, the spin magnetic moments that have deviated from their initial axis return to their initial position of equilibrium, that is to say axis z, while still spinning. This return to equilibrium is called relaxation. It is then possible to measure this rotational movement of the spins in the form of an oscillating radiofrequency signal that is at the same frequency as the exciter magnetic field, that is to say the Larmor resonance frequency. This signal is then received by the antenna.

One of the difficulties encountered with antennas of this kind consists in the fact that they operate in a close electromagnetic field, unlike other antennas, that is to say close to the physical radiating elements.

The intensities of the magnetic field $B_0$ used in medical imaging are conventionally in a range from 0.1 to 3 Tesla.

With these low magnetic field intensities, the operating frequency corresponding to the Larmor frequency is also low. By way of example, for a magnetic field $B_0$ of 1.5 Tesla, the corresponding Larmor frequency is 64 MHz, and for a magnetic field $B_0$ of 3 Tesla, the corresponding Larmor frequency is 128 MHz.

Generally, the low field antennas (between 0.1 and 3 Tesla) used for examining the head are volumetric antennas, called birdcage type or Traverse Electric and Magnetic (TEM) antennas, such as are described in the documents U.S. Pat. Nos. 4,746,866, 4,751,464 and 5,557,247. These birdcage type antennas are optimized to generate the greatest magnetic field with the least power.

These birdcage type antennas comprise at least two radiating elements and are powered via a single channel, that is to say only one power input with a signal phase offset of 90° between the two radiating elements to create a rotating magnetic field, the power feed itself being supplied by a single control element.

This type of antenna enables satisfactory results to be obtained, and particularly a magnetic field $B_1^+$ that is relatively homogeneous throughout the zone that is to be studied using magnetic fields designated as low and medium intensity. In fact, when the magnetic fields applied are low, that is to say up to 3 Tesla, the corresponding Larmor frequency also remains low and the artifacts are tolerable.

However, with greater intensities of magnetic field $B_0$, that is to say equal to or greater than 7 Tesla, these antennas become critical. In fact, the oscillating frequency of magnetic field $B_1$ must be adjusted to match the Larmor frequency, which is proportional to the intensity of static longitudinal magnetic field $B_0$ and so increases to more than 298 Mhz for the proton nucleus, and the effective wavelength of magnetic field $B_1$ is relatively short, in the order of a few tens of centimetres, that is to say about the size of the specimen to be studied, particularly the patient's head.

Moreover, in this frequency range much of the electromagnetic power is lost in the specimen, particularly around the periphery of the specimen, which means that the more distant peripheral zones of the specimen receive less power. In this frequency range, the electromagnetic waves are also shaped irregularly and so create local concentrations of the magnetic field at the centre of the specimen.

Consequently, with these higher magnetic field values the birdcage antennas produce significant artifacts and inhomogeneity in the distribution of the excitation field making them practically unusable. In fact, in the zones of the specimen where the excitation field is low, the oscillating radiofrequency relaxation signal will also be low, which can cause problems if the zone in question is significant for the analysis of the specimen.

A series of phased array type antennas have been developed in which a plurality of surface antennas are linked, each surface antenna having its own path, or channel, for transmitting and receiving the signal. Each surface antenna thus enables an image to be produced of the anatomical region facing its location, the various images then being combined using algorithms to create the final image.

In order to be able to adequately operate these phased array type antennas, each channel from each antenna is linked to a power amplifier, and each power amplifier is controlled with a specific amplitude and phaseshift via a Human-Computer Interaction (HCI).

For this purpose, control procedures have therefore been developed for the purpose of controlling these phased array antennas, these procedures consisting primarily in the use of static and dynamic excitation adjustments during imaging sequences.

The drawback with this technology is the high cost of implementing it, which is due mainly to the need for many more power amplifiers, and most of all the cost of the control electronics required for controlling each channel of the antenna. Accordingly, a separate control system is allocated to each channel of the antenna.

In order to lower the costs of creating an array antenna, a control method has been developed that enables the number of control systems to be reduced due to the fact that these systems use Butler matrices to generate signals.

This control method is mentioned particularly in the article "Slice-Selective RF is pulses for in vivo B1 inhomogeneity mitigation at 7 Tesla using parallel RF excitation with a 16-Element coil", 2008, Kawin Setsompop.

This control method is based on the use of the Butler matrix, which is a passive matrix with low energy dissipation, which means that it can be located between the amplifiers and the antenna channels. This enables to reduce control elements to be used, and also expensive power amplifiers. This matrix is used in known manner to excite certain electromagnetic propagation modes in a cylindrical waveguide. The Butler matrix serves to convert signals in such a way that several outputs of the same amplitude are associated with a single power input and whose phase varies according to the propagation mode to be excited. However, this system is a fixed system, and adjusting the passive phaseshifting components takes a long time. They therefore do not allow of any modularity in terms of the number of antenna channels, despite the fact that various specific Butler matrices have been developed for applications with 2, 4, 8, or 16 channels, and they are only truly optimal for cylindrical systems or objects that can be assimilated by cylindrical waveguides. Accordingly, even the Butler matrix cannot be adapted optimally for the excitations that are set up inside a human head, since the human head is not a cylindrical waveguide and furthermore is not homogeneous.

FIG. 1 is a diagrammatic representation of the principle of controlling using a Butler matrix. In the example shown, four signals emitted by control elements $1a$, $1b$, $1c$, $1d$ are amplified by amplifiers $2a$, $2b$, $2c$, $2d$ and then converted in Butler matrix 3 in such manner that one input is associated with two outputs having the same amplitudes but different phases. Thus, each channel $4a$, $4b$, $4c$, $4d$, $4e$, $4f$, $4g$, $4h$ of the antenna produces a transmission signal with the same amplitude but its own phase.

The use of the Butler matrix to control a phased array antenna in MRI apparatuses is also not able to achieve a distribution of magnetic excitation field $B_1^+$ of sufficient homogeneity with a high magnetic field in the specimen. In order to guarantee that the zones receiving the least amount of power still receive enough power to generate a return signal, it is necessary to increase the global transmission power substantially.

In fact, this technique enables the excitation modes to be chosen from the modes offered by the Butler matrix (and only from these modes) in order to reduce the number of degrees of freedom in the system, and thus also the number of power elements.

Accordingly, the results obtained with this device also do not enable this type of array antenna to be used optimally in a very strong magnetic field, since the Butler excitation modes are not optimal for the brain.

In this context, the present invention aims to resolve the problems outlined in the preceding by suggesting a method for creating a module for controlling a high-frequency phased array type antenna so as to optimise the transmission signal according to the Region of Interest (ROI) to be analysed and at the same time to suggest an economical solution by reducing the number of control elements required for controlling the antenna.

To this end, the invention suggests a method for creating a module for controlling a high-frequency antenna for nuclear magnetic resonance imaging comprising a plurality n of control elements and a plurality m of radiating elements, in which plurality m of radiating elements is greater than plurality n of control elements, and said method comprising in sequence:

a step of determining a distribution map of a magnetic field $B_1^+$;

a step of constructing a matrix $\tilde{B}$ on the basis of the selection of a plurality of x points from said map of $B_1^+$ determined in the previous step, said construction of matrix $\tilde{B}$ being carried out using x×m points $B_{1(i,j)}^+$ where i represents the index of the selected point that varies from 1 to x and j represents the index of radiating element $ER_j$ that varies from 1 to m, such that $\tilde{B}_{(i,j)} = B_{1(i,j)}^+$;

a step of determining singular vectors of said matrix $\tilde{B}$ by singular value decomposition, said singular vectors of said matrix being represented by a matrix $(v)_{k,j}$ where k represents the index of a control element $EP_k$ that varies from 1 to n;

a step of arranging coupling means and/or phase shifting means to form said control module such that a signal $So_j$ of a radiating element $ER_j$ at the output of said control module is a function of relation $$So_j = \sum_{k=1}^{n} V_{k,j} \cdot Si_k;$$

where $Si_k$ represents the input signal of a control element $EP_k$.

The term "control element" is understood here to mean an electronic subassembly generally comprising a fast amplitude modulator and a fast phase modulator that are controlled by the computing system of the MRI apparatus and can be accessed by an operator via a Human-Computer Interaction.

The invention consists in suggesting a method for creating a control module that enables control of m radiating elements ER of a multipath antenna using n control elements EP, number m of radiating elements ER being greater than number n of control elements EP. The conversion of n control elements EP and thus of n control signals into m signals at the inputs of the radiating elements is performed by means of the control module according to the invention.

The control module for the phased array antenna is created by using a singular value decomposition method that enables the definition of the singular vectors of matrix $\tilde{B}$ that represent the map of magnetic field $B_1^+$.

The Singular Value Decomposition (SVD) method of a matrix is known as an important tool in the diagonalisation of real and complex rectangular matrices.

The SVD method is used in the fields of signal processing, statistics, meteorology, and in image compression. However, the application of the singular value decomposition method to magnetic fields for the purpose of optimising a control module that controls transmitted signals in the particular field of NMR is very far removed from the conventional uses thereof, and is completely original.

In fact, the use of this method enables a control module to be created with which it is possible to know the amount of power transmitted to each radiating element with a high degree of accuracy. Accordingly, it is possible to choose the singular vectors of stronger excitations from among various singular vectors while the module is being designed, so as to obtain a control module that supplies less power to the radiating elements when the antenna is being controlled, and which improves the output of such a phased array antenna.

Moreover, this control module created by the method according to the invention enables an operator greater freedom for controlling the antenna regardless of the number of antenna channels, unlike a control method that is based on the Butler matrix principle.

The method according to the invention may also feature one or more of the characteristics described in the following, either individually or in any technically possible combination:

said step of arranging coupling means and/or phase shifting means to form said control module is carried out using couplers, known as branchline couplers, which function as coupling and/or phase shifting means;

said method comprises a step of decomposing said matrix V into a plurality N+1 of matrices according to the equation:

$$v = v_N \times v_{N-1} \times \ldots \times v_1 \times v_0$$

said decomposition into singular values in the step of determining singular vectors of said matrix $\tilde{B}$ is carried out using the equation $\tilde{B}v = u\Sigma$, in which:

u is a unitary matrix having the same dimensions as matrix $\tilde{B}$, and in which the m columns are unitary;

$\Sigma$ is a diagonal matrix having dimensions m×m and in which the diagonal coefficients are positive real numbers;

said step of singular vector determination for said matrix $\tilde{B}$ is carried out using the equation $\tilde{B}^*\tilde{B} = v\Sigma^2 v^*$, in which * represents the hermitian operator;

said step of singular vector determination for said matrix $\tilde{B}$ comprises a substep of selecting n singular vectors from said matrix B;

said substep of selecting n singular vectors from said matrix $\tilde{B}$ is performed by selecting n singular values that have higher values as represented by the diagonal coefficients of matrix $\Sigma$;

said step of determining a distribution map of a magnetic field $B_1^+$ is performed on the basis of an electromagnetic field $B_1$ and with the aid of computer software;

said step of determining a distribution map of a magnetic field $B_1^+$ is performed by measurement.

Other features and advantages of the invention will become more evident with a reading of the description provided in the following, which is for exemplary purposes only and is not intended to be limiting in any way, and with reference to the accompanying drawing, in which:

FIG. 5 shows an example of values for a matrix designated the upper matrix $v_i^u$;

In all figures, identical elements are identified with the same reference numerals.

Figure 1:
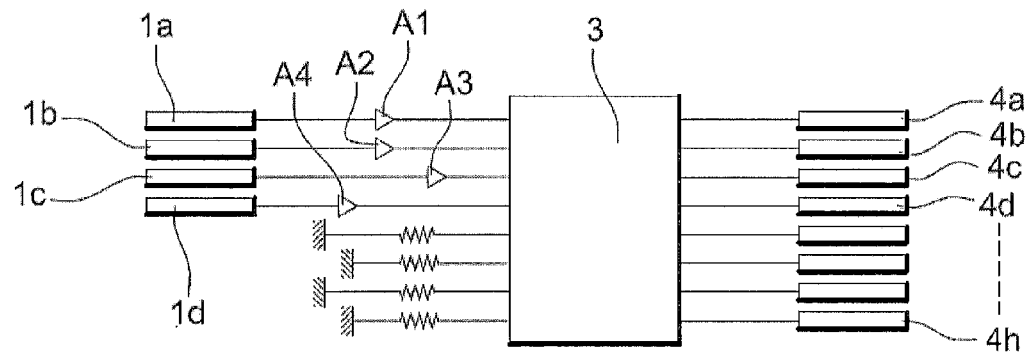
FIG. 1 shows a diagram of a means for controlling a phased array type high-frequency antenna that operates according to the principle of Butler matrices for the purpose of controlling the antenna.

FIG. 1 has already been described in the context of the description of the prior art.

Figure 2:
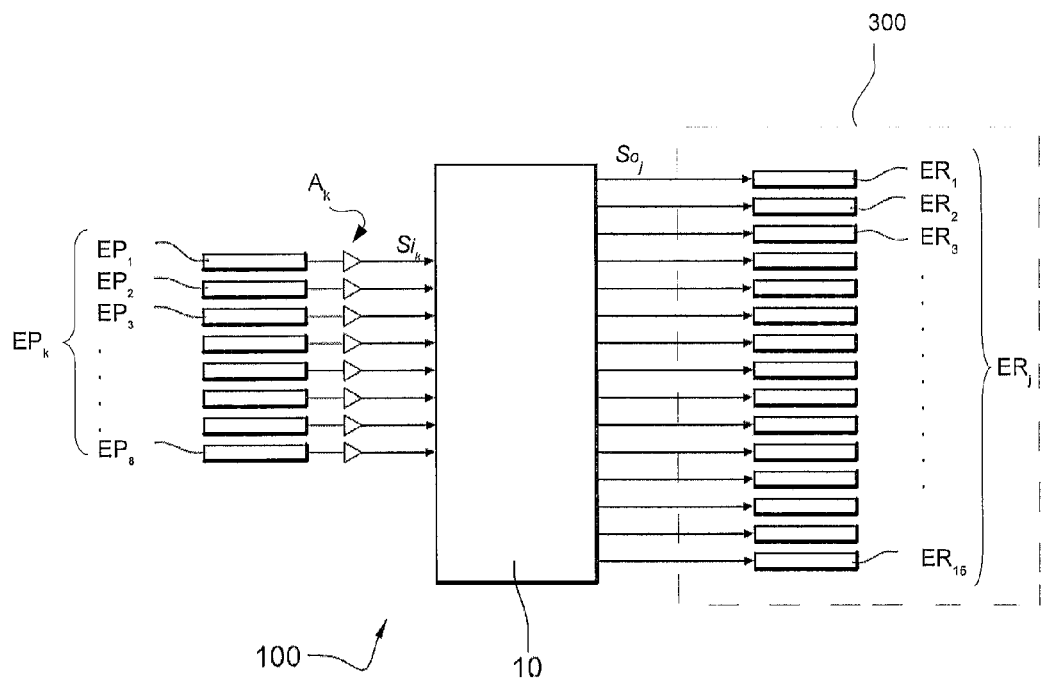
FIG. 2 shows a diagram of a control system for a phased array type high-frequency antenna.

FIG. 2 shows a diagram of a control system 100 that enables control of an power supply to a phased array antenna 300. Control system 100 comprises a plurality n of control elements $EP_k$, k being a variable index from 1 to n, a control module 10 obtained by the creation method according to the invention, connected to plurality m of channels for radiating elements $ER_j$ of antenna 300, j being a variable index from 1 to m. The control system further comprises power amplifiers $A_k$ positioned between control elements $EP_k$ and control module 10.

According to the invention, control module 10 enables a phased array antenna to be controlled using fewer control elements EP than there are radiating elements ER associated with the antenna (that is to say m>n).

For exemplary purposes, the creation method and the control method created thereby will be described for an antenna comprising fifteen independent transmission channels and fifteen radiating elements (m=15) controlled by eight control elements (n=8).

It will be recalled that the term "channel" is used to refer to each power input for the antenna that communicates with a radiating element.

According to the invention, each control element $EP_k$ (that is to say $EP_1, EP_2, \ldots EP_n$) includes an electronic subassembly (not shown) that generally comprises a fast amplitude modulator and a fast phase modulator which are controlled by the MRI computer system of the MRI apparatus and can be accessed by an operator via a man-machine interface.

Accordingly, in our exemplary embodiment of FIG. 2, control module 10 has control elements $EP_k$ transmitting signals $Si_k$ (that is to say $Si_1, Si_2, \ldots, Si_8$) at its input.

The output of control module 10 is connected to each radiating element $ER_j$ of the antenna that receives an output signal $So_j$ (that is to say $So_1, So_2, \ldots, So_{15}$).

The control module thus has a linear transformation effect on a plurality n of input signals Si coming from n control elements to produce a plurality m of output signals So with which to power m radiating elements ER.

The transformation is performed by means of a matrix v such that:

$$So = VSi$$

wherein:

the totality of signals Si is represented by a matrix having dimensions n×1, that is to say that the $k^{th}$ element in the matrix corresponds, in control module 10, to the signal sent by the $k^{th}$ control element $EP_k$, k being a variable integer from 1 to n;

the totality of signals So is represented by a matrix having dimensions m×1, that is to say that the $j^{th}$ element in the matrix corresponds to the power fed into the $j^{th}$ radiating element, j being a variable integer from 1 to m matrix v is a matrix having dimension m×n and unitary in n.

Thus in the example shown in FIG. 2, control module 10 includes storage means comprising transformation matrix v having dimension 15×8.

Figure 3:
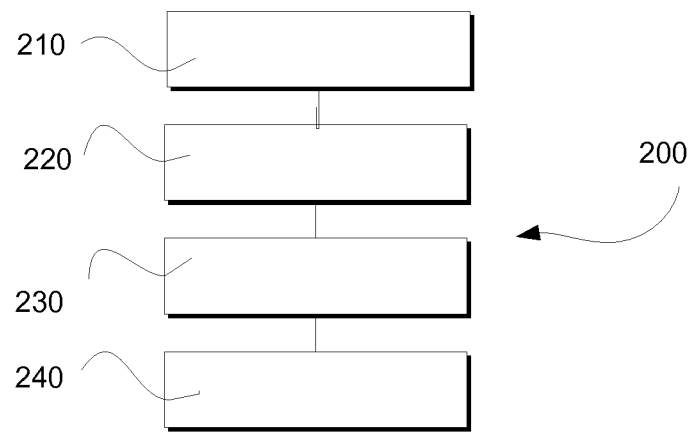
FIG. 3 shows a block diagram of the main steps of the control method according to the invention.

FIG. 3 shows a block diagram representing the main steps of the method for creating control module 10 according to the invention.

The method according to the invention consists of first determining the coefficients of the transformation matrix v obtained by the method called singular value decomposition (SVD) and then physically constructing this matrix using a set of couplers. The singular value decomposition (SVD) procedure applied to a matrix is generally used in the fields of signal processing, statistics, meteorology, and in image compression. However, the application of the singular value decomposition method to magnetic fields for the purpose of optimising a control module that controls transmitted signals in the particular field of NMR is very far removed from the conventional uses thereof, and is entirely original.

Thus, the method according to the invention comprises a first step 210 of creating a map of the distribution of magnetic excitation field $B_1^+$ in the antenna when a "load" is placed inside the antenna.

This map of the magnetic excitation field distribution may be created indifferently by simulation or by taking measurements from a prototype in an MRI scanner.

For exemplary purposes, simulation is conducted using the numerical simulation software HFSS produced by Ansoft. The principle of the simulation consists in systematically studying the distribution of magnetic component $B_1$ such that:

$$B_1 = \begin{vmatrix} B_{1x} \\ B_{1y} \end{vmatrix}$$

indices "x" and "y" refer to a fixed Cartesian coordinate system, linked to the laboratory, on axes X et Y (not shown) and perpendicular to longitudinal axis Z of the antenna (not shown), longitudinal axis Z being the direction of global magnetisation of field $B_0$.

Simulation of magnetic field $B_1$ enables $B_1^+$ to be deduced by means of an intermediate calculation, $B_1^+$ corresponding to the phasor of magnetic field $B_1$, decomposed in a coordinate system that rotates in the same direction as the spins according to the equation:

$$B_1^+ = \vec{B}_1 \cdot \vec{e}_{LHCP}$$

Where $$\vec{e}_{LHCP} = \frac{1}{\sqrt{2}} \begin{vmatrix} 1 \\ j \end{vmatrix}$$

The map representing the distribution of magnetic field $B_1^+$ may also be determined experimentally by measurement based on a prototype. For this, it is sufficient to determine the map from magnetic component $B_1^+$ directly, particularly using an acquisition method called Actual Flip-angle Imaging (AFI) [Vasily L. Yarnykh, Actual Flip-angle Imaging in the Pulsed Steady State. Magn Reson Led 2007; 57: 192-200], which is known from the field of medical imaging.

In order to create a map representing the distribution of the magnetic field by measurement, the prototype or laboratory antenna must include a many control elements EP as radiating elements ER (that is to say m=n).

A second step 220 of the method consists of a step of constructing a matrix $\tilde{B}$ based on a selection of a plurality of points $B_{1(i,j)}^+$ from the map of complex magnetic field $B_1^+$ determined in the course of preceding step 210, the plurality of points being selected via a predetermined mesh of map by an operator using a Human-Computer Interaction.

The mesh of map $B_1^+$ is chosen by the operator according to the desired resolution and the desired resonance frequency that is determined by the applied magnetic field $B_0$.

Advantageously, a mesh of 5 mm, that is to say a mesh containing a plurality of points with a distance of 5 mm between two points, provides the conditions for obtaining a satisfactory resolution for a head type antenna.

With meshes larger than 5 mm, the precision of the results may be degraded and with meshes smaller than 5 mm the calculation elements may become substantial and too voluminous to process relative to the increased resolution obtained thereby.

For this purpose, each voxel extracted from the map of field $B_1^+$, defined in the course of the preceding step 210, is indexed by variable i such that each voxel corresponds to a point $B_{1(i,j)}^+$.

It will be recalled that index j corresponds to the index of radiating elements $ER_j$ of antenna where j is a variable from 1 to m and index k corresponds to the index control elements $EP_k$ where k is a variable from 1 to n.

It will be recalled that a voxel is a pixel in three dimensions, used in three-dimensional spatial representation particularly in the field of medical imaging by digital processing of sections in two dimensions (2D) generated by MRI apparatuses.

For each voxel i there is a position $x_i, y_i, z_i$ at which is associated a point magnetic field $B_{1(i,j)}^+$ transmitted by a radiating element $ER_j$, the order in which the voxels are indexed has no effect on the final result.

Thus, the matrix is compiled as a function of the map constructed in preceding step 210 such that:

$$\tilde{B}_{(i,j)} = B_{1(i,j)}^+$$

Matrix $\tilde{B}$ contains as many row as there were voxels selected in the region of interest (ROI) in the map of oscillating magnetic field $B_1^+$ during step 210, in which the map of the distribution of the magnetic excitation field was constructed, and as many columns (that is to say m columns) as there are radiating elements ER in antenna 300.

Typically, in the example shown in FIG. 2, fifteen radiating elements ER are used, and oscillating magnetic field $B_1^+$ is mapped with a resolution in three dimensions of 32×32×32, resulting a matrix $\tilde{B}$ with 32768 rows and 15 columns.

The third step 230 of the method is a mode determination step, that is to say determination of the singular vectors, the matrix $\tilde{B}$ by applying a singular value decomposition method, also known as the SVD method.

It will be recalled that the term SVD mode is used to refer to the singular vectors from the decomposition of singular values. These modes have nothing to do with the electromagnetic modes of a volumetric or resonant cavity antenna.

The principle of singular value decomposition enables matrices u, Σ, v to be associated with matrix $\tilde{B}$ such that:

$$\tilde{B}v = u\Sigma$$

where:
u is a unitary matrix having the same dimension as matrix $\tilde{B}$, the m columns of which are unitary (that is to say $uu^*=I_m$);
$\Sigma$ is a diagonal matrix with dimension m×m and whose diagonal coefficients are positive real numbers.
v is a square matrix having dimension m×m.

The diagonal coefficients of matrix $\Sigma$ thus represent the singular values of matrix $\tilde{B}$, and the columns of matrix u and matrix v are the singular vectors to the left and right respectively for the corresponding singular values, wherein the singular vectors to the right from matrix v are the modes that are to be determined.

Thus, in our example, matrix u is a matrix with dimensions of 32768×15, and matrices v and E are matrices with dimensions of 15×15.

This decomposition is unique, with a permutation similar to the columns of v, u and $\Sigma$.

The properties of matrix V and matrix U allow the application of equation:

$$(Bv)^*(Bv)=(u\Sigma)^*(u\Sigma)$$

to yield the following new equation:

$$\tilde{B}^*\tilde{B}=v\Sigma^2 v^*$$

It may then be deduced that matrix v is also a eigenvector to matrix $\tilde{B}^*\tilde{B}$, and the eigenvalues to this matrix $\tilde{B}^*\tilde{B}$ are the coefficients of $\Sigma^2$.

Third step 130 includes a substep of selecting n singular values in matrix $\tilde{B}$ from the higher value diagonal coefficients of matrix $\Sigma$.

Thus, a singular value $\alpha_k$, corresponding to a diagonal coefficient of matrix $\Sigma$ is associated for each mode k of matrix $\tilde{B}$. The power efficiency of the $k^{th}$ mode is thus proportional to $\alpha_k^2$, which is why selecting the n stronger values ensures that the modes will be more effective.

Thus for the eight control elements $EP_1$, $EP_2$, $EP_8$, the eight singular values $\alpha_1 \ldots \alpha_8$ that have the higher values of the fifteen are selected, $\alpha_1$ being higher than $\alpha_2$ and so on up to $\alpha_8$.

Third step 130 may also include a substep of classifying the real singular values in ascending order by permutation of the singular vectors.

Each singular value $\alpha_1 \ldots \alpha_8$ is associated with the singular vectors of reduced matrix $u_8$, which has n columns (n=8), $u_8$ being a matrix with a dimension of 32768×8. The columns in reduced matrix $u_8$ represent the magnetic field distribution $B_1^+$ for each of the modes. Reduced matrix $V_8$ having a dimension of 15×8 (that is to say m×n), and whose columns represent the desired modes, is associated with reduced matrix $u_8$.

Thus, the singular vectors, or modes, of matrix $\tilde{B}$ corresponding to the columns in matrix v, are used for transforming n signals Si from control elements EP into m signals So, supplying the m radiating elements ER of antenna 300, so that a radiating element $ER_j$ of the m radiating elements receives a signal $So_j$ equivalent to:

$$So_j = \sum_{k=1}^{n} V_{k,j} \cdot Si_k$$

where j is a variable from 1 to m and k is a variable from 1 to n.

Thus, signals $So_j$ are characterized by an amplitude that is proportional to the sum of the $|v_{k,j}|$ and whose phase is equal to the sum of arg $(v_{k,j})$.

The particular advantage of this decomposition consists in that each of the modes determined thereby is completely independent. In fact, the construction of matrix v ensures that the modes are orthogonal with magnetic excitation field $B_1^+$.

Since matrix v is a unitary matrix, such as $vv^*=I_{15}$, it is capable of ensuring that the output power from control module 10 is equivalent to the input power as show in the following demonstration:

$$\|S_o\|_2^2 = S_o^* S_o = (VS_i)^* VS_i = S_i^* V^* VS_i = S_i^* S_i = \|S_i\|_2^2$$

Thus, the transformation is carried out with no loss of energy.

This decomposition is also advantageous to the extent that the choice of modes is made according to third step 230 as a function of their energy yields. In fact, as was noted in the preceding, the singular values of matrix $\tilde{B}$, that is to say the diagonal coefficients of matrix $\Sigma$, are proportional to $\sqrt{\iiint_{tête} |B_1^+|^2 dV}$ for each mode studied.

Accordingly, for an arbitrary input power it is possible to deduce the energy output of the load that is introduced into the antenna, in our case the patient's head, with the equation:

$$E_m^+ = \iiint_{tête} 1/2 \mu |B_1^+|^2 dV$$

Since fields $B_1^+$ are orthogonal for each mode, the total magnetic excitation energy that reaches the ROI zone in the patient is equal to the sum of the excitation energies of each mode, if multiple modes are excited.

This calculation of the energy output may also be performed on the basis of a distribution map of $B_1^+$ obtained by simulation or measurement, since the only elements necessary for this calculation are the values of $B_1^+$ and the phase difference between one radiating element ER and another.

Fourth step 240 consists of arranging coupling means and phase shifting means so as to be able to reproduce the transformation of signals from matrix v as determined in the preceding step 230.

It will be recalled that the matrix v obtained is unitary in n, that is to say matrix v proves the equation: $v^*v=I_n$, where $I_n$ is the identity matrix of dimension n×n.

Thus, by introducing intermediate outputs $So_{j,l}$ from row l, where l is a variable from 0 to N, and intermediate unitary matrices $v_l$ (l>0) having dimension m×m and $v_0$(l=0) having dimension m×n such that:

$$So_{j,0}=Si \text{ for } l=0$$

$$So_{j,l}=v_l So_{j,l-1} \text{ for } N \geq l>0$$

$$So_{j,N}=So_j$$

If intermediate matrices $v_l$ are unitary, this then gives $v_N \times v_{N-1} \times \ldots \times v_1 \times v_0$, which is unitary with dimension m×n.

This principle of decomposition in a plurality of matrices is used to construct matrix v such that:

$$So=vSi=v_N \times v_{N-1} \times \ldots \times v_1 \times v_0 Si$$

Figure 4:
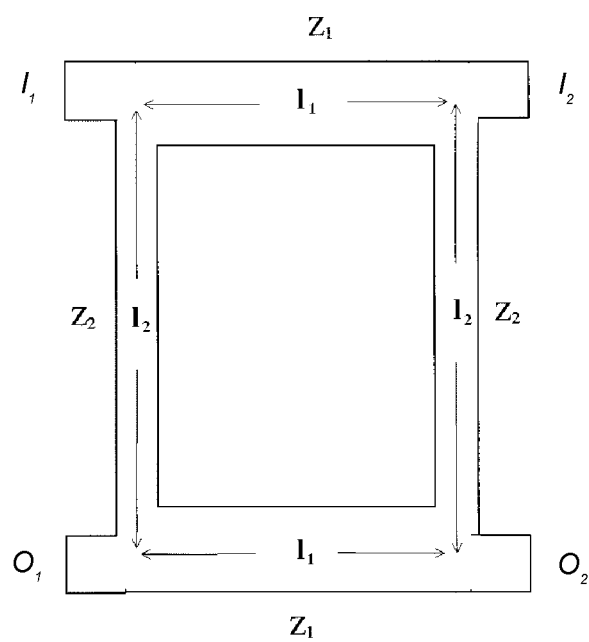
FIG. 4 is a schematic representation of a branchline type coupler used in the fourth step of the creation method shown in FIG. 3.

Then, each matrix $V_0, V_1, \ldots, V_N$ is constructed using couplers of the branchline coupler type, as shown in FIG. 4.

Branchline type couplers are directional couplers which are generally used by dividing the energy at 3 decibels.

In general, the branchline coupler has two inputs and two outputs, so that it is able to transform inputs $$\begin{bmatrix} I_1 \\ I_2 \end{bmatrix}$$

into an output $$\begin{bmatrix} O_1 \\ O_2 \end{bmatrix}$$

according to the equation:

$$\begin{bmatrix} O_1 \\ O_2 \end{bmatrix} = -\begin{bmatrix} j\cos\theta & \sin\theta \\ \sin\theta & j\cos\theta \end{bmatrix}\begin{bmatrix} I_1 \\ I_2 \end{bmatrix}$$

where θ is freely selectable.

It is also possible to associate a phaseshift with the branchline coupler based on a transmission line that delays the wave. This phase shift may be represented by the unitary matrix:

$$\begin{bmatrix} e^{j\phi_1} & 0 \\ 0 & e^{j\phi_2} \end{bmatrix}$$

The product is thus a unitary matrix:

$$C(\theta, \phi_1, \phi_2) = \begin{bmatrix} e^{j\phi_1}j\cos\theta & e^{j\phi_1}\sin\theta \\ e^{j\phi_2}\sin\theta & e^{j\phi_2}j\cos\theta \end{bmatrix}$$

First matrix $v_0$ must have dimension m×n, equivalent to embodiment of our example shown in FIG. 2 having dimension 15×8.

In order to obtain 15 outputs from 8 inputs using branchline couplers as described in the preceding, 7 branchline couplers are needed, each of which has an input loaded with a resistance, for example 50Ω. In this case, the transformation matrix of each branchline coupler for an input I becomes:

$$\begin{bmatrix} O_1 \\ O_2 \end{bmatrix} = -\begin{bmatrix} j\cos\theta \\ \sin\theta \end{bmatrix}[I] = -\begin{bmatrix} j\cos\theta \cdot I \\ \sin\theta \cdot I \end{bmatrix}$$

Thus, by connecting a branchline coupler of this design to 7 of the 8 inputs, 15 outputs are obtained, the eighth input being connected directly to an output in the use of a coupler. Thus by connecting the first input to the first and ninth outputs, the second input to the second and tenth outputs, and so on, and the eighth input directly to the eighth output one obtains the following $V_0$ matrix:

$$V_0(\theta_1, \ldots, \theta_7) =$$

$$\begin{bmatrix}
j\cos\theta_1 & 0 & 0 & 0 & 0 & 0 & 0 & 0 \\
0 & j\cos\theta_2 & 0 & 0 & 0 & 0 & 0 & 0 \\
0 & 0 & j\cos\theta_3 & 0 & 0 & 0 & 0 & 0 \\
0 & 0 & 0 & j\cos\theta_4 & 0 & 0 & 0 & 0 \\
0 & 0 & 0 & 0 & j\cos\theta_5 & 0 & 0 & 0 \\
0 & 0 & 0 & 0 & 0 & j\cos\theta_6 & 0 & 0 \\
0 & 0 & 0 & 0 & 0 & 0 & j\cos\theta_7 & 0 \\
0 & 0 & 0 & 0 & 0 & 0 & 0 & 1 \\
\sin\theta_1 & 0 & 0 & 0 & 0 & 0 & 0 & 0 \\
0 & \sin\theta_2 & 0 & 0 & 0 & 0 & 0 & 0 \\
0 & 0 & \sin\theta_3 & 0 & 0 & 0 & 0 & 0 \\
0 & 0 & 0 & \sin\theta_4 & 0 & 0 & 0 & 0 \\
0 & 0 & 0 & 0 & \sin\theta_5 & 0 & 0 & 0 \\
0 & 0 & 0 & 0 & 0 & \sin\theta_6 & 0 & 0 \\
0 & 0 & 0 & 0 & 0 & 0 & \sin\theta_7 & 0
\end{bmatrix}$$

Matrices $v_1, \ldots, v_{N-1}, v_N$ are also created using branchline type couplers. In order to create these matrices, the couplers do not carry a load at their inputs, but create a phase shift through θ at their outputs.

Each of matrices $v_1, \ldots, v_{N-1}, v_N$ may be created by alternating two matrices, which will be called upper matrix $v_l^u$ and lower matrix $v_l^d$, where l is a variable from 1 to N.

Upper matrix $v_l^u$ is constructed such that a coupler connects the first and second inputs, the third and fourth inputs, and so on up to the thirteenth and fourteenth inputs, leaving the fifteenth input unchanged.

Lower matrix $v_l^d$ is constructed such that a coupler connects the second and third inputs, the fourth and fifth inputs, and so on up to the fourteenth and fifteenth inputs, leaving the first input unchanged.

Figure 6:
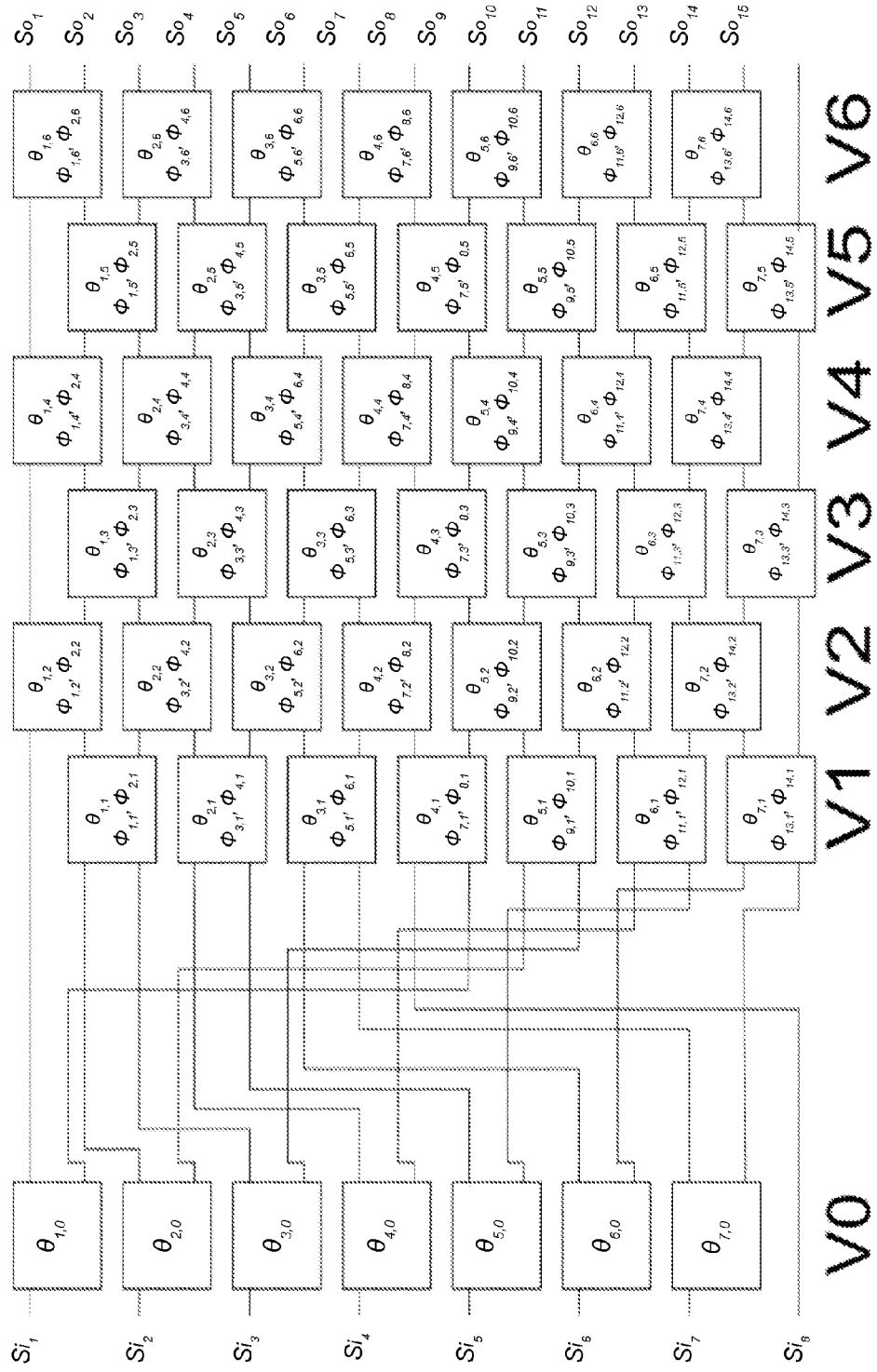
FIG. 6 shows an exemplary arrangement of the branchline couplers of FIG. 4 obtained by the method for creating a control module according to the invention.

This configuration avoids having the cross the couplers and simplifies the design of matrix v of control module 10. Such a design is shown for exemplary purposes in FIG. 6.

Thus, in the case where the number m of radiating elements ER is even, upper matrix $v_l^u$ performs a transformation on all of the inputs that couple pairs 1-2, 3-4, and so on; and lower matrix $v_l^d$ does not perform a transformation on the first or last inputs, the couplers connecting pairs 2-3, 4-5, and so on.

Finally, the location of the couplers allows the construction of a matrix $v_1, \ldots, v_{N-1}, v_N$ of which each depends on 7 coupling parameters θ and fifteen phase shift parameters φ.

One example of values for creating upper matrix $v_l^u$ is illustrated in the reference to FIG. 5.

Thus $v_0, v_1, \ldots, v_N$ are defined and enable matrix v to be created while verifying previous hypotheses.

However, values θ and φ still need to be determined for each of matrices $v_0, v_1, \ldots, v_N$ in order to obtain the desired matrix v, that is to say the matrix v that was determined in the preceding steps.

According to an advantageous form of the invention, matrix v is approximated by an approximating matrix $v_{app}$ which thus helps to reduce the costs of constructing this matrix. Accordingly, approximating matrix $v_{app}$ has the same unitary matrix properties as matrix v but the values are approximate with an approximate tolerance range E such that:

$$\|V_{app} - V\|_2 < \epsilon$$

Thus, values θ and φ are determined by optimization, such that:

$$\Delta_{SVD}(\theta_{1,0},\ldots,\theta_{7,N},\phi_{1,0},\ldots,\phi_{15,N})=V_N(\theta_{1,N},\ldots,\theta_{7,N},\phi_{1,N},\ldots\phi_{15,N})\times\ldots\times V_0(\theta_{1,0},\ldots,\theta_{7,0},\phi_{1,0},\ldots\phi_{15,0})-v$$

where $\theta_{i,j}$ is the $i^{th}$ coupling element of $v_j$; i being a variable from 1 to 7 according to our exemplary configuration;

$\phi_{i,j}$ is the $i^{th}$ phase shifting element of $V_j$; i being a variable from 1 to 15 according to our exemplary configuration; and with $\|\Delta_{SVD}\|=\epsilon$ This optimisation shows that N=12 is generally sufficient for 15 radiating elements with a tolerance of less than 5% per channel.

Thus, according to our embodiment, the construction of matrix v then requires 91 couplers and 195 phase shift elements.

The 286 real parameters must be optimized using optimization algorithms, such as the Matlab type software optimization algorithms.

The invention has been described with particular reference to the control of a high frequency antenna of an MRI apparatus for head examinations; however, the control method and particularly the SVD method described is also applicable to any body part and for any patient, child or adult, or even for significantly overweight patients, and so on.

Of course, the magnetic fields $B_1$ that are measured or simulated depend on the body part or the object that is introduced into the antenna. The calculation results vary according to the body part that is introduced, and from patient to patient.

The method according to the invention that uses a singular value decomposition method makes it easier to optimise the result of adjusting static and dynamic excitation, and particularly the quality of the signal adjustment using Gauss Newton type optimization algorithms, or any type of algorithm that requires an initial value for optimisation.

In this case, the optimisation may be carried out initially for the first mode, and then progressively for the subsequent modes.

The invention claimed is:

1. A method for creating a control module for a high-frequency antenna for nuclear magnetic resonance imaging comprising a plurality n of control elements and a plurality m of radiating elements, which plurality m of radiating elements is greater than the plurality n of control elements, said method comprising:

determining a distribution map of a magnetic field $B_1^+$;

constructing a matrix $\tilde{B}$ on the basis of the selection of a plurality of x points from said distribution map of magnetic field $B_1^+$, said construction of matrix $\tilde{B}$ being carried out using x×m points $B_{1(i,j)}^+$ where i represents an index of the selected point that varies from 1 to x and j represents an index of radiating element $ER_j$ that varies from 1 to m, such that $\tilde{B}_{(i,j)}=B_{1(i,j)}^+$;

determining singular vectors of said matrix $\tilde{B}$ by singular value decomposition, said singular vectors of said matrix $\tilde{B}$ being represented by a matrix $(v)_{k,j}$ where k represents the index of a control element that varies from 1 to n;

arranging coupling means and/or phase shifting means to form said control module such that a signal $So_j$ of a radiating element at an output of said control module is a function of relation:

$$So_j = \sum_{k=1}^{n} V_{k,j} \cdot Si_k;$$

where $Si_k$ represents an input signal of a control element.

2. The method for creating a control module for a high-frequency antenna for nuclear magnetic resonance imaging apparatus according to claim 1, wherein said step arranging is created using couplers serving as the means for coupling and/or the means for phase shifting.

3. The method for creating a control module for a high-frequency antenna for nuclear magnetic resonance imaging apparatus according to claim 1, comprising decomposing said matrix v into a plurality N+1 of matrices according to the equation:

$$v=v_N\times v_{N-1}\times\ldots\times v_1\times v_0.$$

4. The method for creating a control module for a high-frequency antenna for nuclear magnetic resonance imaging apparatus according to claim 1, wherein said decomposition into singular values is carried out using the equation:

$$\tilde{B}v=u\Sigma$$

in which:

u is a unitary matrix having the same dimensions as matrix $\tilde{B}$, and in which the m columns are unitary;

$\Sigma$ is a diagonal matrix having dimensions m×m and in which the diagonal coefficients are positive real numbers.

5. The method for creating a control module for a high-frequency antenna for nuclear magnetic resonance imaging apparatus according to claim 4, wherein said singular vector determination for said matrix $\tilde{B}$ is carried out using the equation:

$$\tilde{B}^*\tilde{B}=v\Sigma^2 v^*$$

wherein * represents a hermitian operator.

6. The method for creating a control module for a high-frequency antenna for nuclear magnetic resonance imaging apparatus according to claim 1, wherein said singular vector determination for said matrix $\tilde{B}$ comprises selecting n singular vectors from said matrix $\tilde{B}$.

7. The method for creating a control module for a high-frequency antenna for nuclear magnetic resonance imaging apparatus according to claim 6, wherein said of selecting n singular vectors from said matrix $\tilde{B}$ is performed by selecting n singular values that have higher values as represented by the diagonal coefficients of matrix $\Sigma$, wherein $\Sigma$ is a diagonal matrix having dimensions m×m and in which the diagonal coefficients are positive numbers.

8. The method for creating a control module for a high-frequency antenna for nuclear magnetic resonance imaging apparatus according to claim 1, wherein said determining a distribution map of a magnetic field $B_1^+$ is performed by an electromagnetic field $B_1$ with the aid of computer software.

9. The method for creating a control module for a high-frequency antenna for nuclear magnetic resonance imaging apparatus according to claim 1, wherein said determining a distribution map of a magnetic field $B_1^+$ is performed by measurement from a prototype in an MRI scanner.

10. A control module obtained by the creation method according to claim 1, comprising an arrangement of coupling means and phase shifting means such that an output signal $So_j$ from said control module, where j represents the index of an output signal from a plurality m of output signals, is a function of the equation:

$$So_j = \sum_{k=1}^{n} V_{k,j} \cdot Si_k$$

where: $Si_k$ represents the input signal of said control module.

* * * * *